United States Patent
Liu et al.

(10) Patent No.: US 10,236,786 B2
(45) Date of Patent: *Mar. 19, 2019

(54) INVERTER CAPACITOR WITH PHASE-OUT BUS BAR

(71) Applicant: Galatech, Inc., Milpitas, CA (US)

(72) Inventors: Wenjun Liu, Santa Clara, CA (US);
Robert James Ramm, Mountain View, CA (US)

(73) Assignee: GALATECH, INC., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/831,307

(22) Filed: Dec. 4, 2017

(65) Prior Publication Data
US 2019/0052184 A1 Feb. 14, 2019

Related U.S. Application Data

(63) Continuation-in-part of application No. 15/675,615, filed on Aug. 11, 2017.

(51) Int. Cl.
*H02M 7/537* (2006.01)
*H02M 7/00* (2006.01)
*H05K 7/20* (2006.01)

(52) U.S. Cl.
CPC ........... *H02M 7/003* (2013.01); *H02M 7/537* (2013.01); *H05K 7/209* (2013.01)

(58) Field of Classification Search
CPC .......... H02M 7/003; H02M 7/48; H02M 7/53; H02M 7/537; H02M 1/08; H02M 1/088; H02M 1/14; H02M 1/143; H02M 2001/0048; H02M 1007/217
See application file for complete search history.

(56) References Cited

U.S. PATENT DOCUMENTS

| | | | | |
|---|---|---|---|---|
| 5,623,399 A | * | 4/1997 | Ishii | ...................... H02M 7/003 363/132 |
| 8,653,652 B2 | * | 2/2014 | Tokuyama | ............ H01L 25/072 257/722 |
| 2012/0300522 A1 | | 11/2012 | Tokuyama et al. | |
| 2014/0254228 A1 | | 9/2014 | Ying et al. | |

(Continued)

OTHER PUBLICATIONS

Liu, Notice of Allowance, U.S. Appl. No. 15/675,615, dated Feb. 13, 2018, 8 pgs.

(Continued)

*Primary Examiner* — Matthew Nguyen
(74) *Attorney, Agent, or Firm* — Morgan, Lewis & Bockius LLP

(57) ABSTRACT

The various implementations described herein include inverter devices and systems. In one aspect, an inverter includes: a case; a capacitor within the case having a first terminal and a second terminal; a first bus bar including a first portion within the case and a second portion extending from the case to contact a first transistor; a second bus bar including a first portion situated in the case and a second portion extending from the case to contact a second transistor; and a phase-out bus bar including a first portion situated in the case, a second portion extending from the case to contact the first transistor, and a third portion extending from the case to contact the second transistor.

17 Claims, 15 Drawing Sheets

(56) References Cited

U.S. PATENT DOCUMENTS

2014/0268969 A1* 9/2014 Crouch ................ H02M 7/003
 363/141
2016/0013706 A1* 1/2016 Mukunoki ........... H02K 11/024
 310/68 D
2017/0310318 A1* 10/2017 Kamiya ............... H03K 17/127

OTHER PUBLICATIONS

Liu, Office Action, U.S. Appl. No. 15/952,144, dated Jul. 27, 2018, 19 pgs.

\* cited by examiner

INVERTER CAPACITOR WITH PHASE-OUT BUS BAR

RELATED APPLICATION

This is a continuation-in-part of U.S. patent application Ser. No. 15/675,615, filed Aug. 11, 2017, entitled "Inverter Capacitor with Phase-Out Bus Bar," which is incorporated by reference in its entirety.

TECHNICAL FIELD

This relates generally to power inverters, including but not limited to, inverters in which the capacitor is integrated with portions of phase-out bus bars in a case.

BACKGROUND

Power inverters convert direct current (DC) to alternating current (AC). An important parameter of any inverter is its efficiency, which is a measure of the incoming power compared to the outgoing power. Inductance within an inverter lowers the efficiency of the inverter.

SUMMARY

Accordingly, there is a need for power inverters with lower inductance. The inductance of an inverter is based in part on an area between bus bars of the inverter. Thus, there is a need for systems and/or devices with reduced (e.g., minimized) area between the bus bars.

The disclosed implementations include inverters in which capacitors are encased with portions of phase-out bus bars, positive rails (i.e., positive bus bars), and negative rails (i.e., negative bus bars) within the case. Such implementations reduce (e.g., minimize) inductance of the inverters by reducing (e.g., minimizing) area between the rails and the phase-out bus bars, reduce hotspots, and increase reliability. Such implementations also lower the costs and complexity in manufacturing and assembling the inverters.

In some implementations, an inverter includes: (1) a case; (2) a capacitor situated in the case, the capacitor having a first terminal and a second terminal; (3) a first transistor external to the case and coupled to the first terminal of the capacitor; (4) a second transistor external to the case and coupled between the first transistor and the second terminal of the capacitor; (5) a first bus bar to connect the first terminal of the capacitor to the first transistor, the first bus bar comprising a first portion situated in the case and a second portion extending from the case to contact the first transistor; (6) a second bus bar to connect the second terminal of the capacitor to the second transistor, the second bus bar comprising a first portion situated in the case and a second portion extending from the case to contact the second transistor; and (7) a phase-out bus bar to connect the first transistor to the second transistor, the phase-out bus bar comprising a first portion situated in the case, a second portion extending from the case to contact the first transistor, and a third portion extending from the case to contact the second transistor.

In some implementations, a three-phase inverter includes: (1) a sealed case; (2) a capacitor sealed in the case, the capacitor having a first terminal and a second terminal; (3) first, second, third, fourth, fifth and sixth pluralities of transistors external to the case, where: (a) the first, third, and fifth pluralities of transistors are coupled to the first terminal of the capacitor; and (b) the second, fourth, and sixth pluralities of transistors are coupled to the second terminal of the capacitor; (4) a first bus bar to connect the first terminal of the capacitor to the first, third, and fifth pluralities of transistors, the first bus bar comprising a first portion sealed in the case and respective portions extending from the case to contact respective transistors of the first, third, and fifth pluralities of transistors; (5) a second bus bar to connect the second terminal of the capacitor to the second, fourth, and sixth pluralities of transistors, the second bus bar comprising a first portion sealed in the case and respective portions extending from the case to contact respective transistors of the second, fourth, and sixth pluralities of transistors; (6) a first phase-out bus bar to connect the first plurality of transistors to the second plurality of transistors and to provide a first phase of alternating current, the first phase-out bus bar comprising a portion sealed in the case and respective portions extending from the case to contact respective transistors of the first and second pluralities of transistors; (7) a second phase-out bus bar to connect the third plurality of transistors to the fourth plurality of transistors and to provide a second phase of alternating current, the second phase-out bus bar comprising a portion sealed in the case and respective portions extending from the case to contact respective transistors of the third and fourth pluralities of transistors; and (8) a third phase-out bus bar to connect the fifth plurality of transistors to the sixth plurality of transistors and to provide a third phase of alternating current, the third phase-out bus bar comprising a portion sealed in the case and respective portions extending from the case to contact respective transistors of the fifth and sixth pluralities of transistors.

Thus, inverter devices are provided with low (e.g., minimized) inductance, thereby increasing the effectiveness of, efficiency of, and user satisfaction with such devices.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

Like reference numerals refer to corresponding parts throughout the drawings and specification. Like fill patterns indicate corresponding parts throughout the drawings.

DETAILED DESCRIPTION

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Many modifications and variations of this disclosure can be made without departing from its spirit and scope, as will be apparent to those skilled in the art. The specific implementations described herein are offered by way of example only, and the disclosure is to be limited only by the terms of the appended claims, along with the full scope of equivalents to which such claims are entitled.

Figure 1A:
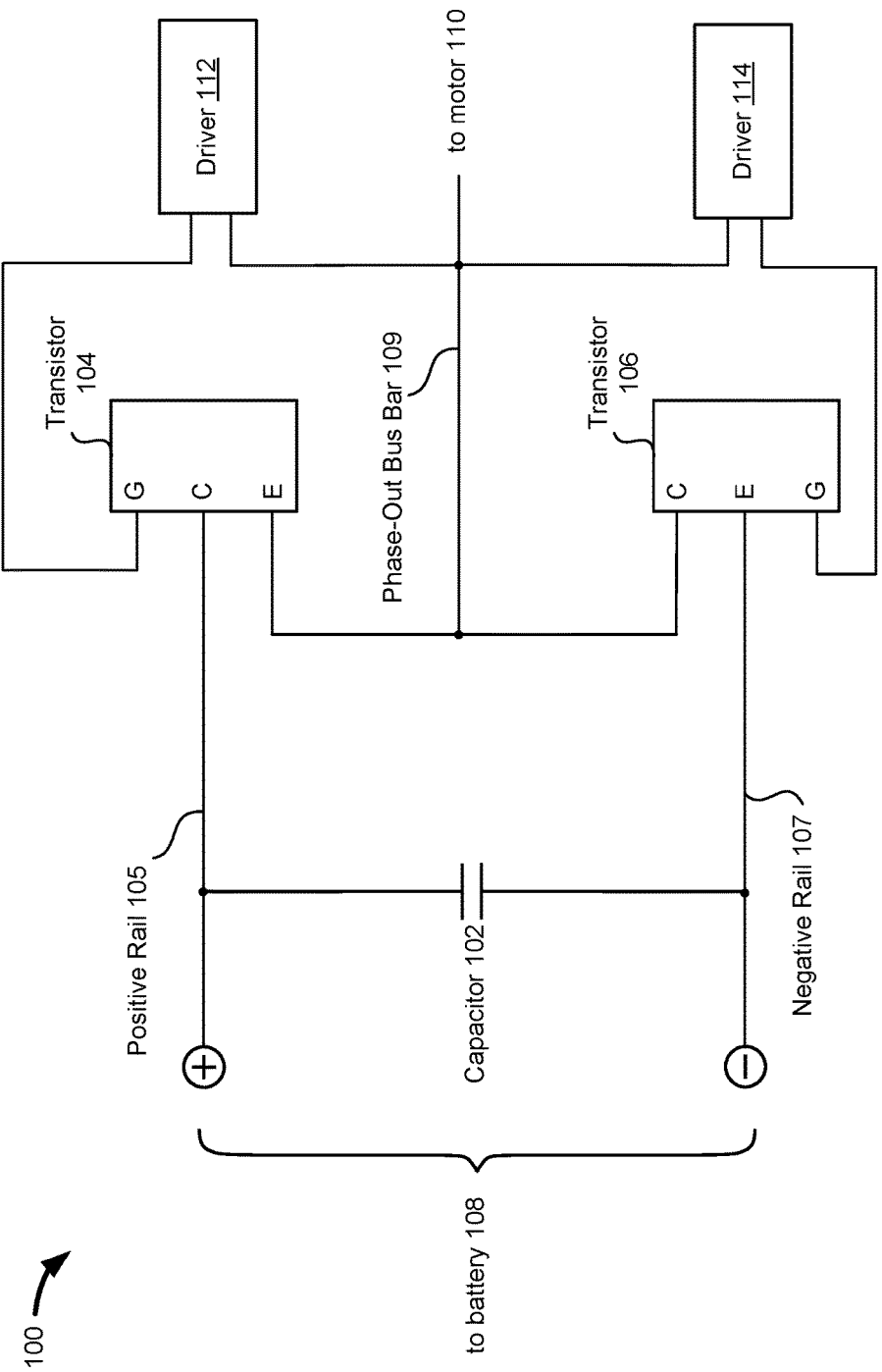
FIG. 1A is a schematic diagram illustrating components of an inverter in accordance with some implementations.

FIG. 1A is a schematic diagram illustrating components of an inverter 100 in accordance with some implementations. The inverter 100 includes a capacitor 102 electrically coupled to transistors 104 and 106 via positive rail 105 and negative rail 107. The positive rail 105 and negative rail 107 may be implemented as respective bus bars. The positive rail 105 and transistor 104 are electrically coupled to a positive terminal of the capacitor 102, while the negative rail 107 and transistor 106 are electrically coupled to a negative terminal of the capacitor 102. The negative rail 107 is further coupled to a negative terminal of a battery 108 and the positive rail is further coupled to a positive terminal of the battery 108. In accordance with some implementations, direct current (DC) from the battery 108 is converted by the inverter 100 to alternating current (AC) and provided to a motor 110. A phase-out bus bar 109, which connects the transistors 104 and 106, provides the AC to the motor 110.

In various implementations, the capacitor 102 is a wound film capacitor, ceramic capacitor, or electrolytic capacitor. In some implementations, the capacitor 102 is composed of a plurality of energy-storage components (i.e., capacitor components) coupled to one another in parallel.

In some implementations (e.g., as shown in FIG. 1A), the transistors 104 and 106 are bipolar transistors, such as insulated-gate bipolar transistors (IGBTs) that each include a gate terminal ("G"), a collector terminal ("C"), and an emitter terminal ("E"). In other implementations, one or more (e.g., all) of the transistors 104 and 106 are field-effect transistors (FETs), such as metal-oxide semiconductor field-effect transistors (MOSFETs) (e.g., silicon carbide (SiC) MOSFETs) or gallium-nitride (GaN) FETs, that each include a gate terminal and two source/drain terminals.

As shown in FIG. 1A, the collector terminal of the transistor 104 is coupled to the positive terminal of the capacitor 102 via the positive rail 105. The emitter terminal of the transistor 104 is coupled to the collector terminal of the transistor 106 via the phase-out bus bar 109. The emitter terminal of the transistor 106 is coupled to the capacitor 102 via negative rail 107.

The gate terminal of the transistor 104 is coupled to a driver 112 and the gate terminal of the transistor 106 is coupled to a driver 114. In some implementations, the drivers 112 and 114 comprise driver circuitry (e.g., respective integrated circuits) on a printed circuit board (PCB), such as board 702 in FIG. 7. The drivers 112 and 114 switch the transistors 104 and 106 on and off in an alternating manner, thus alternatingly coupling the phase-out bus bar 109 to the positive rail 105 and negative rail 107, to produce AC on the phase-out bus bar.

Figure 1B:
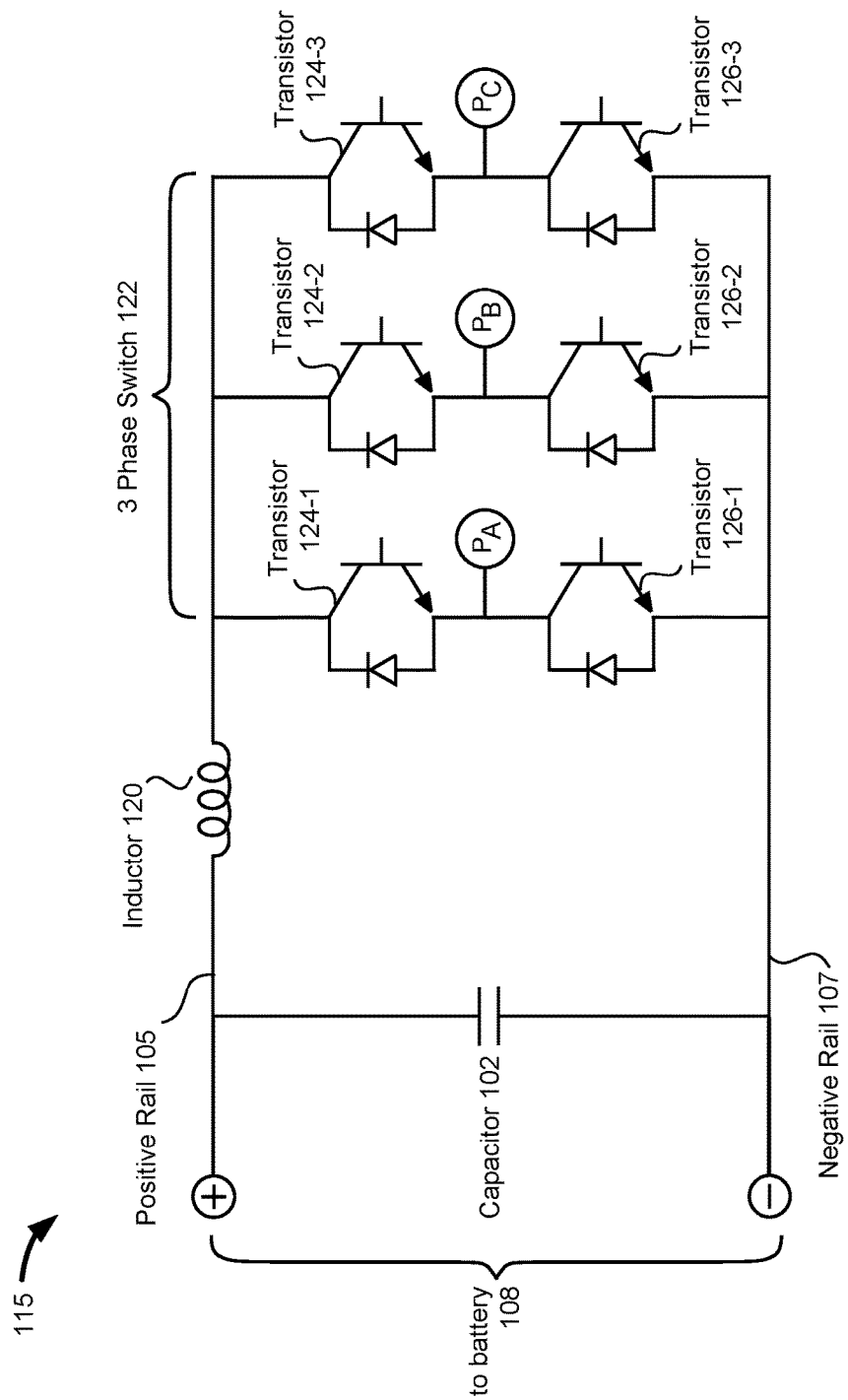
FIG. 1B is a schematic diagram illustrating components of a three-phase inverter in accordance with some implementations.
Figure 5:
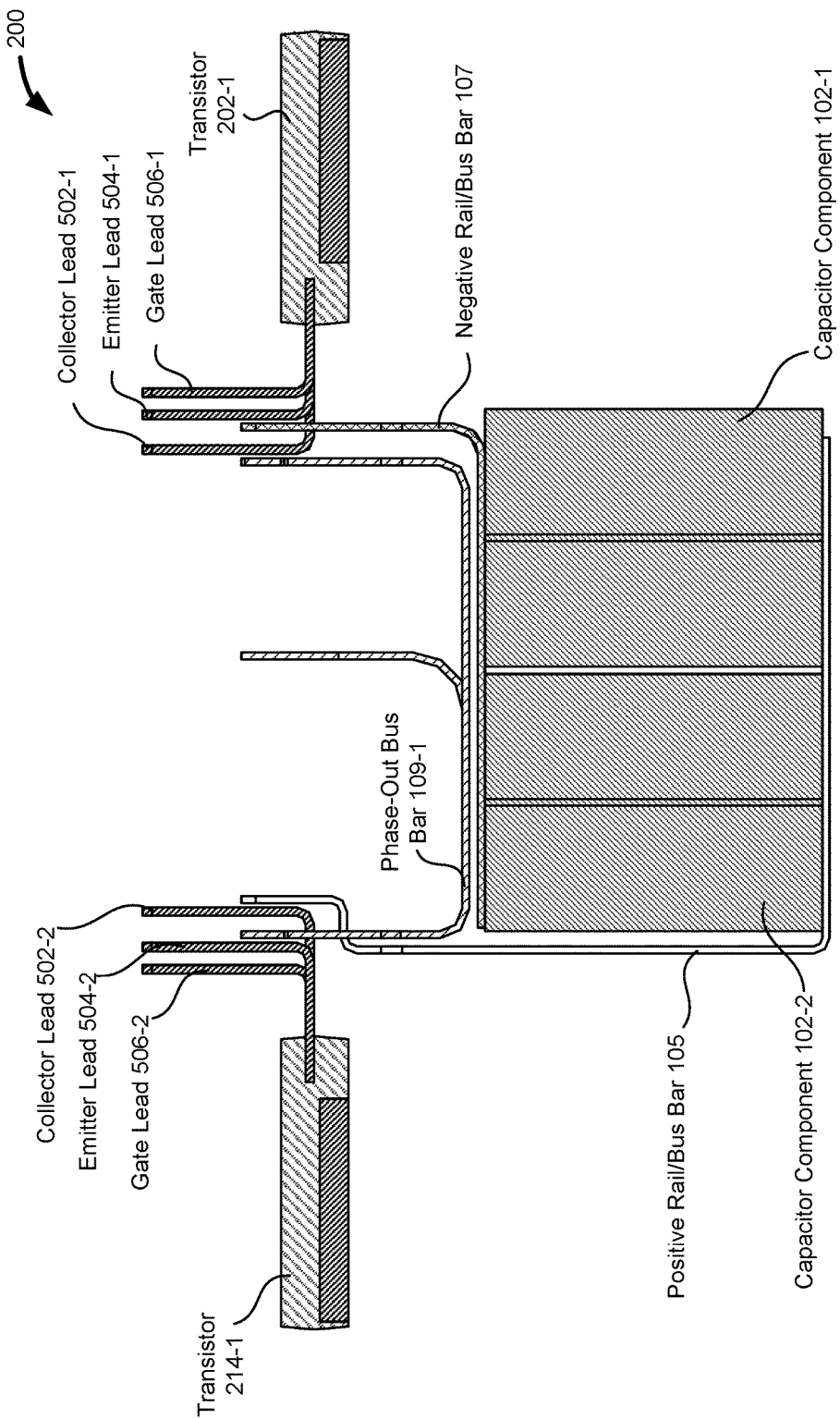
FIG. 5 illustrates a cross-sectional view of an inverter (e.g., the three-phase inverter of FIG. 2) in accordance with some implementations.

FIG. 1B is a schematic diagram illustrating a three-phase inverter 115 in accordance with some implementations. The inverter 115 includes a capacitor 102 coupled to a three-phase switch 122 via the positive rail 105 and negative rail 107. An inductor 120 on positive rail 105 represents commutating inductance between the rails and phase-out bus bars. This inductance 120, which is a parasitic inductance, is reduced (e.g., minimized) by reducing area between the rails 105 and 107 and the phase-out bus bars (e.g., as shown in FIG. 5). (A commutating inductance is also present in the inverter 100 but is not shown in FIG. 1A for simplicity.)

The three-phase switch 122 includes transistors 124 (124-1, 124-2, and 124-3) coupled to the capacitor 102 via the positive rail 105 and transistors 126 (126-1, 126-2, and 126-3) coupled to the capacitor 102 via the negative rail 107. Pairs of transistors 124-1 and 126-1, 124-2 and 126-2, and 124-3 and 126-3 are each coupled in series between the positive rail 105 and negative rail 107. In some implementations, the transistors 124 are coupled to the positive rail 105 via respective collector terminals, and the transistors 126 are coupled to the negative rail 107 via respective emitter terminals (e.g., the transistors 124 and 126 are IGBTs). In some implementations, the transistors 124 and 126 are FETs (e.g., SiC MOSFETs or GaN FETs); the transistors 124 are coupled to the positive rail 105 via respective source/drain terminals and the transistors 126 are coupled to the negative rail 107 via respective source/drain terminals. The inverter 115 further includes three phase-out bus bars, denoted PA, PB, and Pc, which are coupled between respective terminals of respective pairs of the transistors 124 and 126. For example, PA, PB, and Pc are coupled to the respective emitter terminals of transistors 124 and collector terminals of transistors 126: Pais coupled to the emitter terminal of transistor 124-1 and to the collector terminal of transistor 126-1, PB is coupled to the emitter terminal of transistor 124-2 and to the collector terminal of transistor 126-2, and Pc is coupled to the emitter terminal of transistor 124-3 and to the collector terminal of transistor 126-3. The transistors are driven by drivers (e.g., drivers 112 and 114, FIG. 1A). The timing of the drivers is varied between the pairs of transistors 124 and 126, such that each phase-out bus bar PA, PB, and Pc provides a distinct phase of AC. In some implementations, the phase-out bus bars are coupled to a motor, such as the motor 110 (FIG. 1A).

Figure 2:
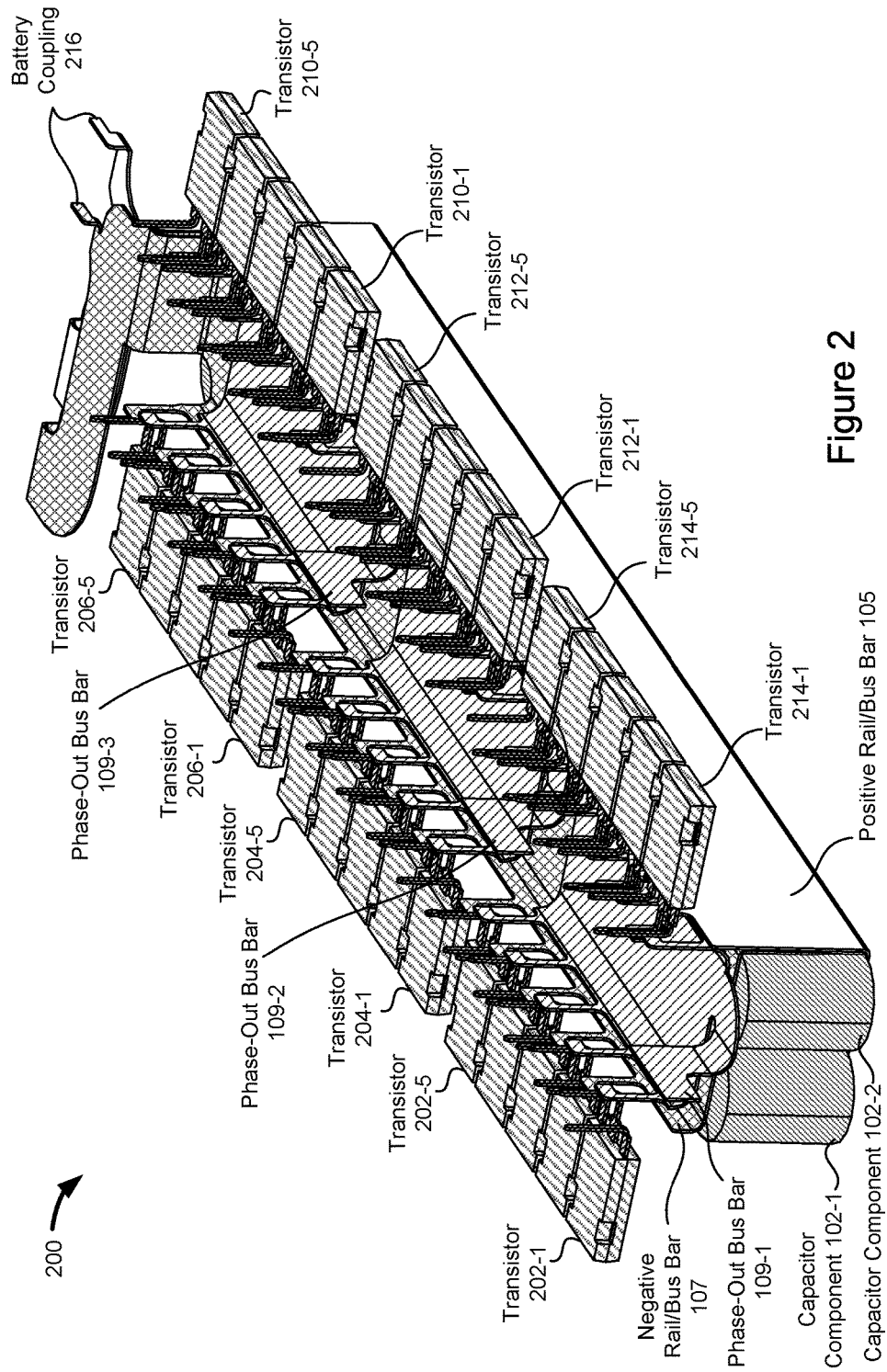
FIG. 2 is a perspective diagram illustrating components of a three-phase inverter in accordance with some implementations.
Figure 3A:
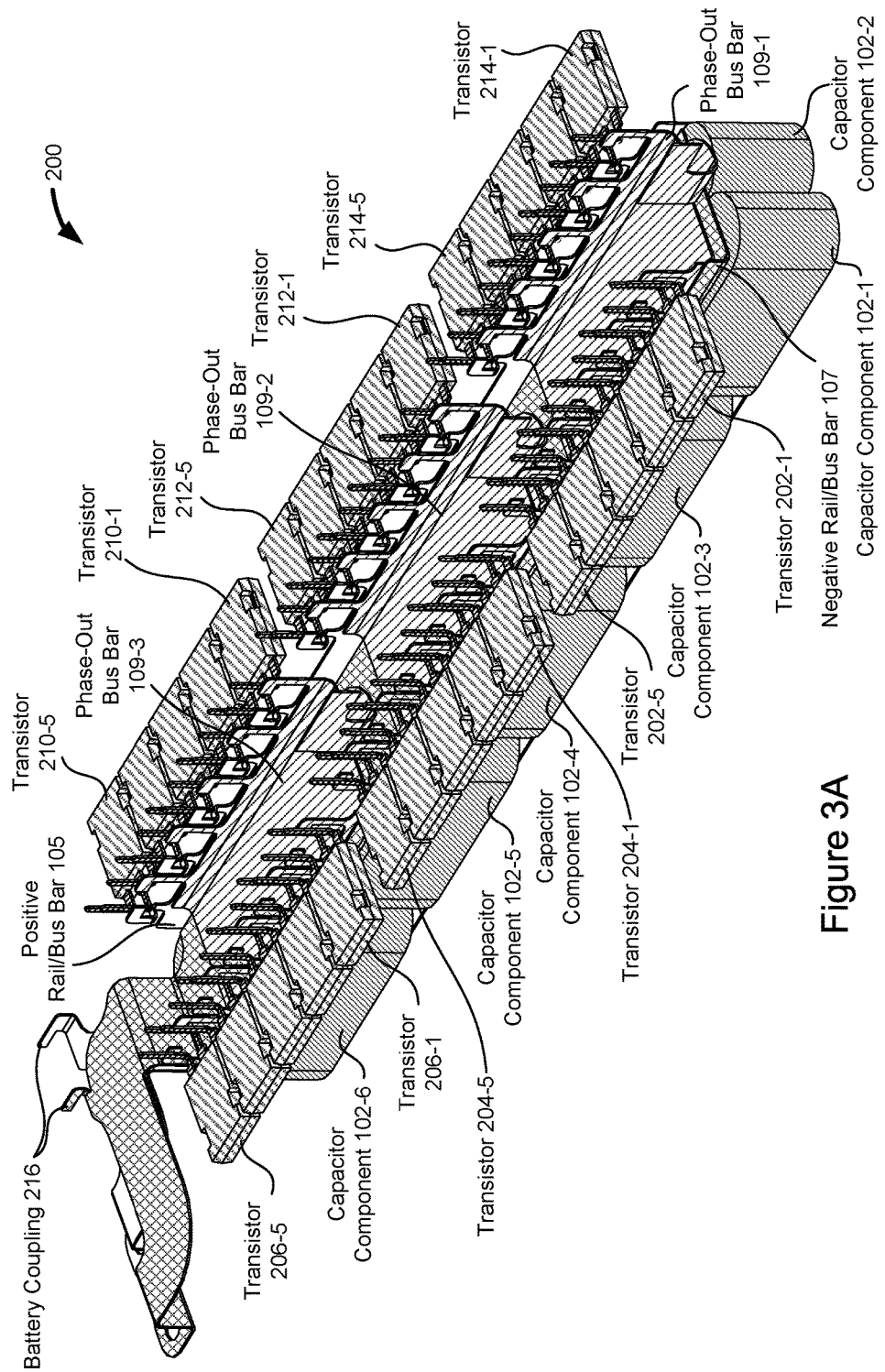
FIGS. 3A-3B are perspective diagrams illustrating components of the three-phase inverter of FIG. 2 in accordance with some implementations.
Figure 3B:
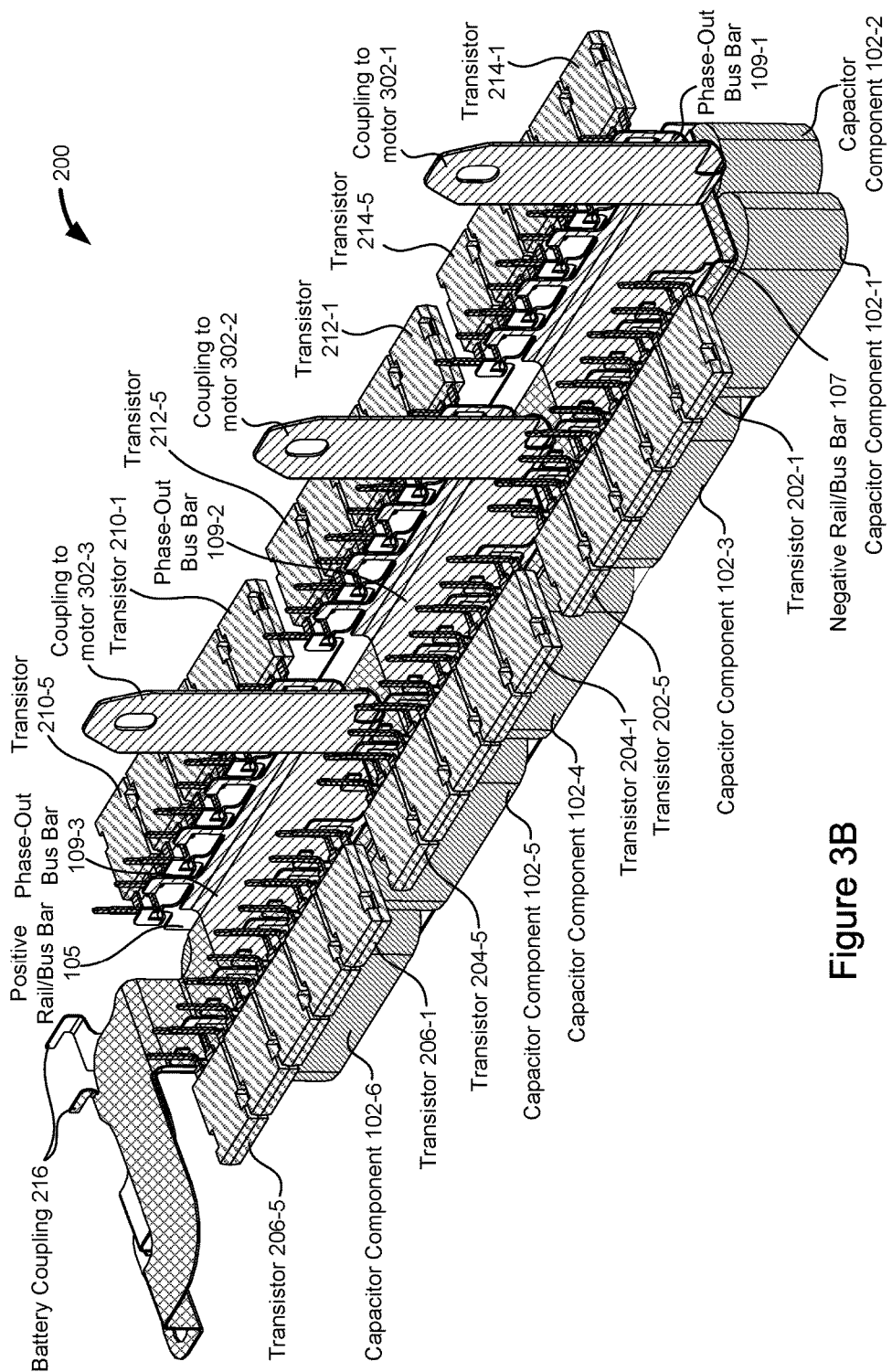
Figure 4:
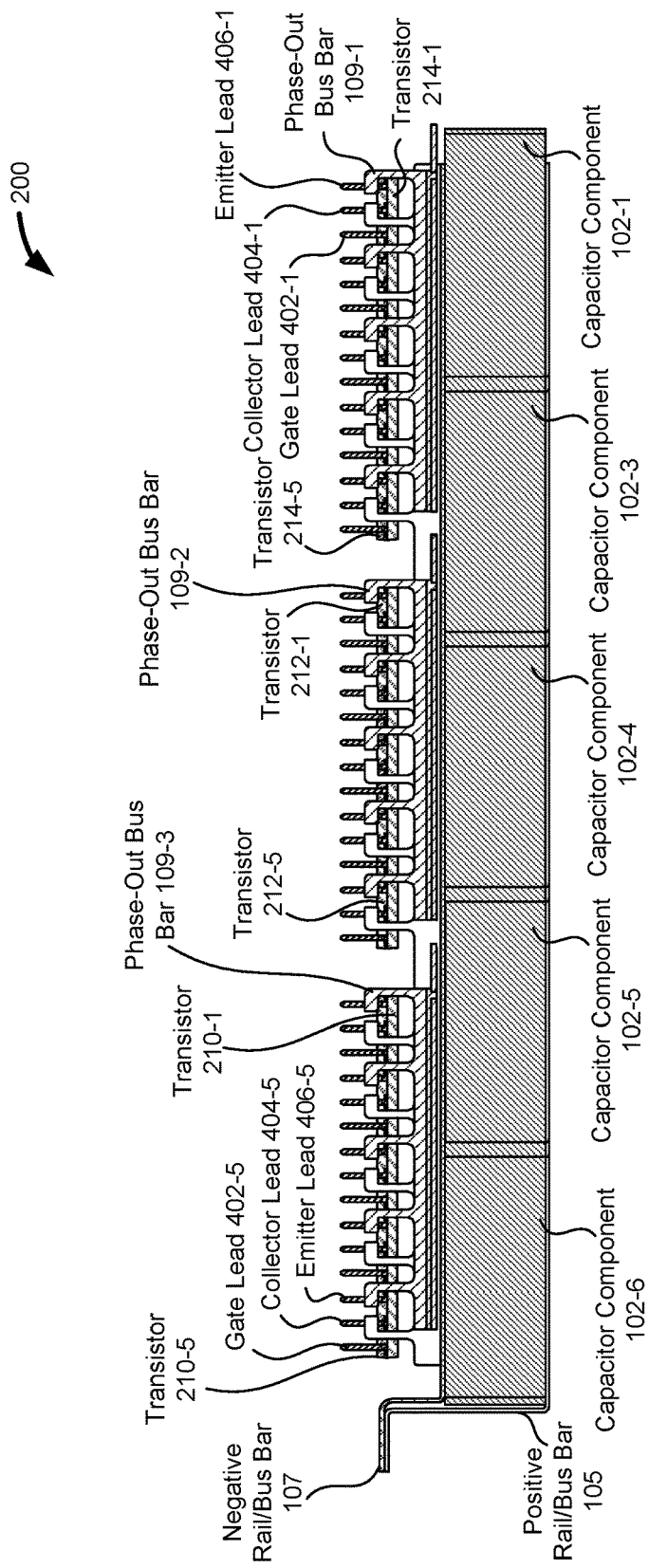
FIG. 4 illustrates a side-view of the three-phase inverter of FIG. 2 in accordance with some implementations.

FIGS. 2, 3A-3B, 4, and 5 illustrate various views of a three-phase inverter 200, which is an example of the three-phase inverter 115 (FIG. 1B), in accordance with some implementations. FIG. 2 shows capacitor components 102-1 and 102-2 coupled to transistors 202 (e.g., 202-1 through 202-5), 204 (e.g., 204-1 through 204-5), 206 (e.g., 206-1 through 206-5) via negative rail 107 and coupled to transistors 210 (e.g., 210-1 through 210-5), 212 (e.g., 212-1 through 212-5), and 214 (e.g., 214-1 through 214-5) via positive rail 105. The negative rail 107 and positive rail 105 are implemented as respective bus bars. The transistors 202 are coupled to the transistors 214 via a phase-out bus bar 109-1, the transistors 204 are coupled to the transistors 212 via a phase-out bus bar 109-2, and the transistors 206 are coupled to the transistors 210 via a phase-out bus bar 109-3.

The transistors 202-1 through 202-5 are thus arranged in parallel between the negative rail/bus bar 107 and the phase-out bus bar 109-1. The transistors 204-1 through 204-5 are thus arranged in parallel between the negative rail/bus bar 107 and the phase-out bus bar 109-2. The transistors 206-1 through 206-5 are thus arranged in parallel between the negative rail/bus bar 107 and the phase-out bus bar 109-3. The transistors 210-1 through 210-5 are thus arranged in parallel between the positive rail/bus bar 105 and the phase-out bus bar 109-3. The transistors 212-1 through 212-5 are thus arranged in parallel between the positive rail/bus bar 105 and the phase-out bus bar 109-2. And the transistors 214-1 through 214-5 are thus arranged in parallel between the positive rail/bus bar 105 and the phase-out bus bar 109-1.

In some implementations, the transistors 202, 204, 206, 210, 212, and/or 214 are bipolar transistors (e.g., IGBTs). Alternatively, the transistors 202, 204, 206, 210, 212, and/or 214 are FETs (e.g., SiC MOSFETs or GaN FETs). The transistors 202, 204, and 206 each include three leads, with a first lead (e.g., corresponding to an emitter terminal or source/drain terminal of the transistor) coupled to the negative rail/bus bar 107 and a second lead (e.g., corresponding to a collector terminal or source/drain terminal of the transistor) coupled to a corresponding phase-out bus bar 109. The transistors 210, 212, and 214 each include three leads, with a first lead (e.g., corresponding to a collector terminal of the transistor) coupled to the positive rail/bus bar 105 and a second lead (e.g., corresponding to an emitter terminal of the transistor) coupled to a corresponding phase-out bus bar 109. For example, FIG. 5 shows the transistor 202-1 having a collector lead 502-1, an emitter lead 504-1, and a gate lead 506-1 and transistor 214-1 having a collector lead 502-2, an emitter lead 504-2, and a gate lead 506-2. The collector lead 502-1 of transistor 202-1 is coupled to the emitter lead 504-2 of transistor 214-1 via the phase-out bus bar 109-1 (e.g., by soldering or welding the collector lead 502-1 and emitter lead 504-2 to the phase-out bus bar 109-1), the emitter lead 504-1 of transistor 202-1 is coupled to the negative rail/bus bar 107 (e.g., soldered or welded to the negative rail/bus bar 107), and the collector lead 502-2 of transistor 214-1 is coupled to the positive rail/bus bar 105 (e.g., soldered or welded to the positive rail/bus bar 105).

In some implementations, the third lead of each transistor 202, 204, and 206 (e.g., corresponding to a gate terminal of the transistor) is coupled to driver circuitry (not shown) (e.g., drivers 114, FIG. 1A). In some implementations, the third lead of each transistor 210, 212, and 214 (e.g., corresponding to a gate terminal of the transistor) is coupled to driver circuitry (not shown) (e.g., drivers 112, FIG. 1A).

The positive rail/bus bar 105 and the negative rail/bus bar 107 each include a respective battery-coupling portion 216 for coupling to a battery, such as the battery 108 (FIG. 1B). The phase-out bus bars 109-1 through 109-3 each include a respective motor-coupling portion 302-1 through 302-3 (FIG. 3B) for coupling the phase-out bus bars 109 to a motor (e.g., motor 110, FIG. 1A), in accordance with some implementations.

In some implementations, the capacitor 102 has a positive terminal (e.g., at a first end) (e.g., on the bottom, or alternatively on the top, of the capacitor 102) and a negative terminal (e.g., at a second end opposite of the first end) (e.g., on the top, or alternatively the bottom, of the capacitor 102). The capacitor 102 comprises multiple capacitor components (e.g., capacitor components 102-1 through 102-6 and other capacitor components that are not visible in the drawings due to perspective) in accordance with some implementations.

As shown in FIG. 5, the positive rail/bus bar 105 is coupled to a first side (e.g., the bottom), and thus to a positive terminal, of the capacitor 102 and the negative rail/bus bar 107 is coupled to a second side (e.g., the top), and thus to a negative terminal, of the capacitor 102. In some implementations, the phase-out bus bars 109 overlay the negative rail/bus bar 107 so as to minimize an area between the phase-out bus bars 109 and the negative rail/bus bar 107. The rail/bus bars 105 and 107 and the phase-out bus bars 109 are composed of an electrically-conductive material. For example, the rails/bus bars 105 and 107 and the phase-out bus bars 109 are composed of metal (e.g., copper).

In some implementations, the areas between the rail/bus bars and the phase-out bus bars 109 shown in FIG. 5 (e.g., the area between the negative rail/bus bar 107 and the phase-out bus bar 109-1) are filled with an insulating material (e.g., a thermally and/or electrically insulating material). For example, one or more (e.g., all) of the areas are filled with an epoxy.

Although the figures show the positive rail/bus bar 105 coupled to a side of the capacitor opposite of the phase-out bus bars 109 and transistors, in some implementations, the relative positioning of the positive rail/bus bar 105 and the negative rail/bus bar 107 is reversed, such that the positive rail/bus bar 105 is coupled to a side of the capacitor closest to the phase-out bus bars 109 and the transistors (not shown).

Although the figures show sets of five parallel transistors (e.g., transistors 202-1 through 202-5 and transistors 214-1 through 214-5), in some implementations, a different number of transistors are used (e.g., 3, 4, or 6 transistors) for each set of parallel transistors. In some implementations, the inverter is configured to operate with varying numbers of transistors for different phases. For example, the inverter is configured to utilize two sets of three transistors for a first phase (e.g., corresponding to phase-out bus bar 109-1), utilize two sets of four transistors for a second phase (e.g., corresponding to phase-out bus bar 109-2), and utilize two sets of six transistors for a third phase (e.g., corresponding to phase-out bus bar 109-3). In some implementations, the inverter is configured to utilize transistors of varying size and performance.

Figure 6:
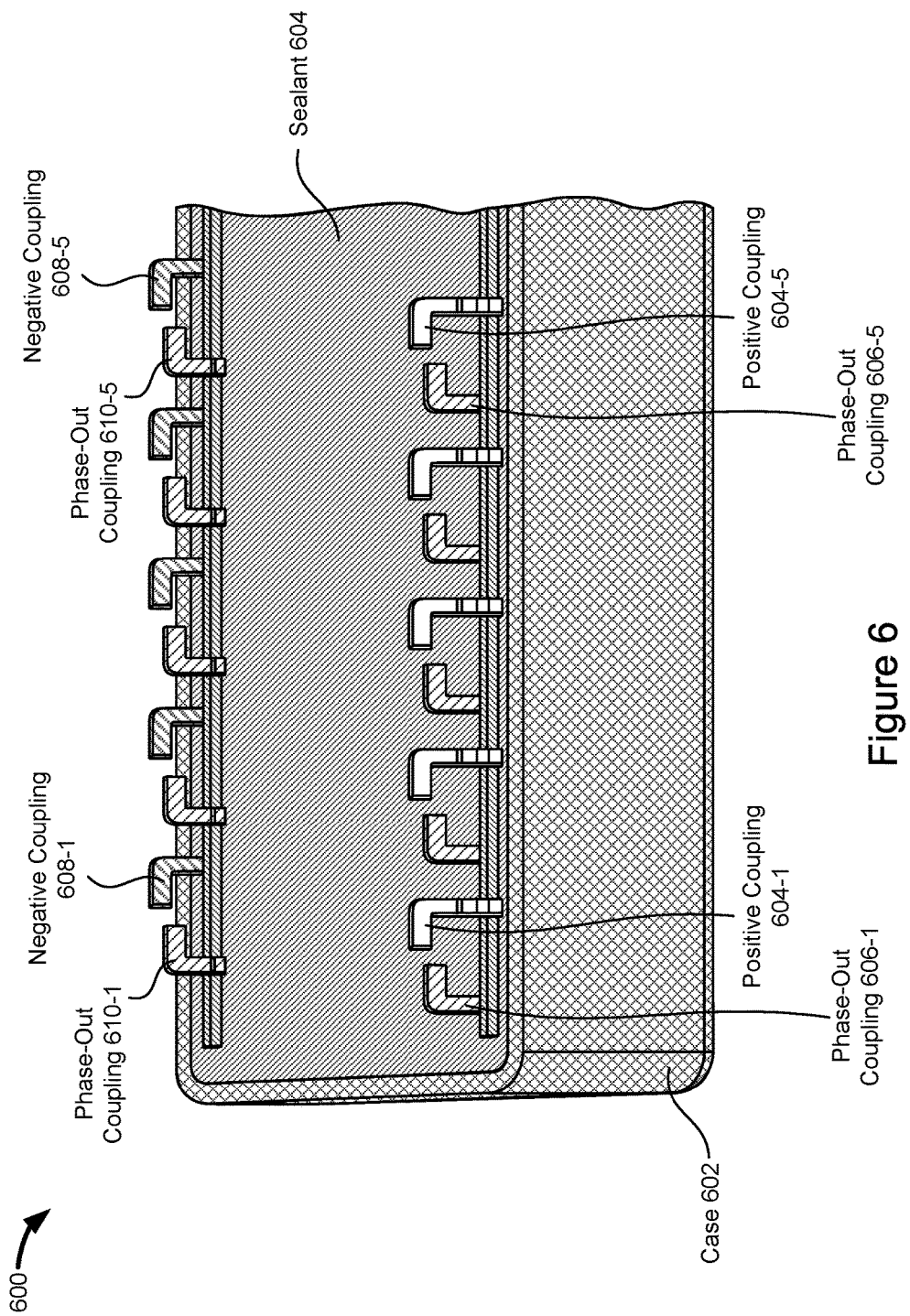
FIG. 6 is a perspective diagram illustrating components of an inverter (e.g., the three-phase inverter of FIG. 2) with encased components in accordance with some implementations.

FIG. 6 is a perspective diagram illustrating components of an inverter 600 with encased components in accordance with some implementations. The capacitor 102 and portions of the positive rail/bus bar 105, negative rail/bus bar 107, and phase-out bus bars 109 are encased in a case 602 such that coupling portions of the positive rail/bus bar 105, the negative rail/bus bar 107, and the phase-out bus bars 109 extend from the case 602. The coupling portions of the positive rail/bus bar 105 include positive couplings 604

(e.g., 604-1 through 604-5) to contact a first set of transistors (e.g., the transistors 214 in FIG. 2). The coupling portions of the negative rail/bus bar 107 include negative couplings 608 (e.g., 608-1 through 608-5) to contact a second set of transistors (e.g., the transistors 202 in FIG. 2). The coupling portions of the phase-out bus bars 109 include phase-out couplings 606 (e.g., 606-1 through 606-5 for phase-out bus bar 109-1) to contact the first set of transistors, and phase-out couplings 610 (e.g., 610-1 through 610-5 for phase-out bus bar 109-1) to contact the second set of transistors. In some implementations, battery-coupling portions of the positive rail/bus bar 105 and the negative rail/bus bar 107 (e.g., battery-coupling portions 216) extend from the case 602. In some implementations, motor-coupling portions of the phase-out bus bars 109 (e.g., motor-coupling portions 302) extend from the case 602.

In accordance with some implementations, the capacitor 102 and portions of the positive rail/bus bar 105, negative rail/bus bar 107, and phase-out bus bars 109 are enclosed in the case 602 with a sealant 604, such as epoxy. In some implementations, the case 602 is composed of a plastic or polymer. In some implementations, the case 602 is adapted to provide structural support for the inverter 600. In some implementations, the case 602 and sealant 604 are adapted to prevent moisture from contacting the capacitor 102.

Although the coupling portions shown in FIG. 6 are flag-shaped, in various implementations, the coupling portions have other geometric (e.g., rectangular) or non-geometric shapes.

In accordance with some implementations, during assembly of the inverter, the rails/bus bars 105 and 107 and phase-out bus bars 109 are first mechanically coupled with the capacitor 102 to provide a capacitor assembly. The capacitor assembly is then placed in the case 602 and the sealant 604 is applied to seal the capacitor assembly within the case 602. After sealing the case 602, the transistors 202, 204, 206, 210, 212, and 214 are coupled to respective coupling portions 604 of the positive rail/bus bar 105, coupling portions 606 and 610 of the phase-out bus bars 109, and coupling portions 608 of the negative rail/bus bar 107.

Figure 7:
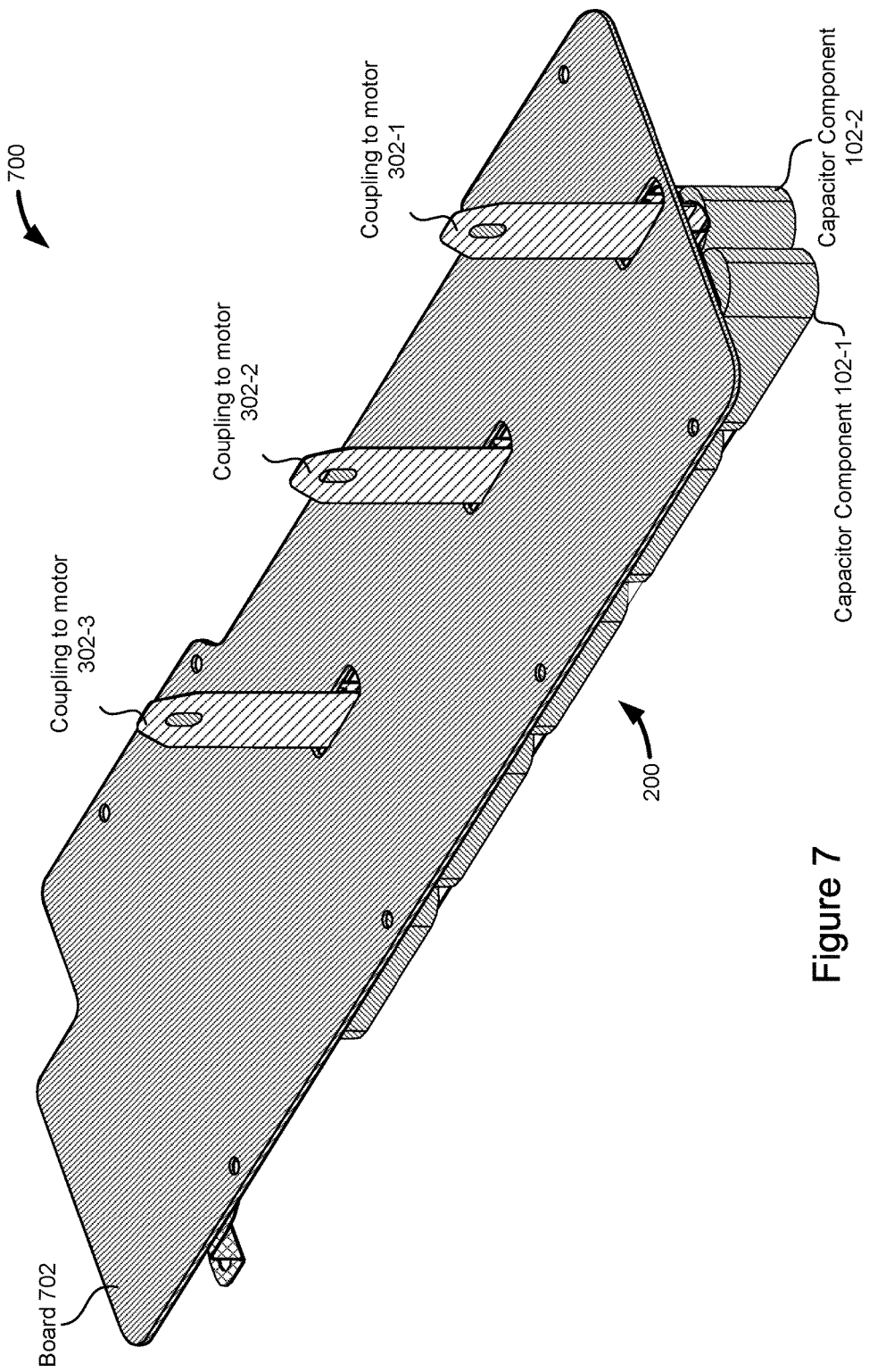
FIG. 7 is a perspective diagram illustrating components of a three-phase inverter (e.g., the three-phase inverter of FIG. 2) with an associated circuit board in accordance with some implementations.
Figure 8:
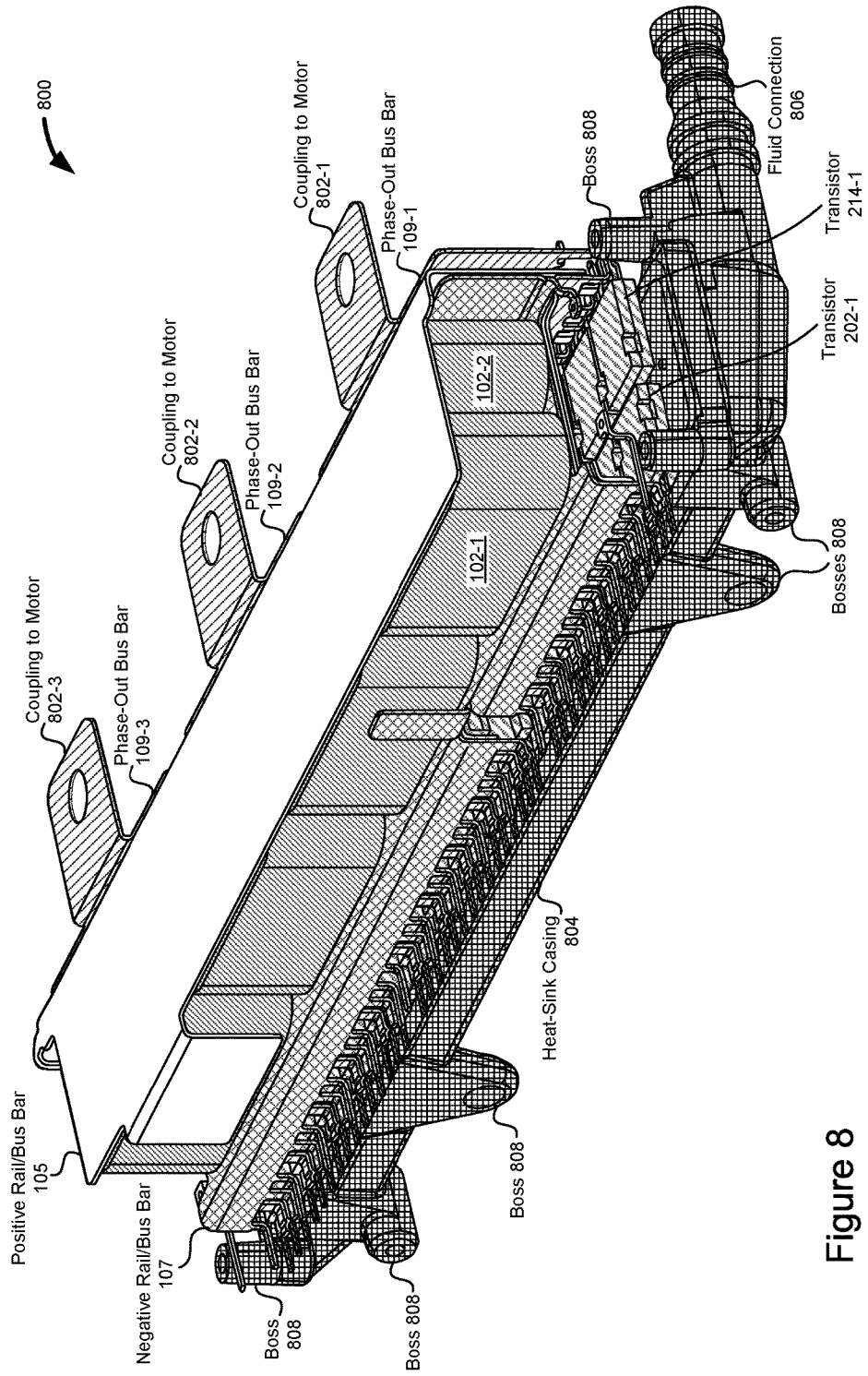
FIG. 8 is a perspective diagram illustrating components of a three-phase inverter in accordance with some implementations.
Figure 9:
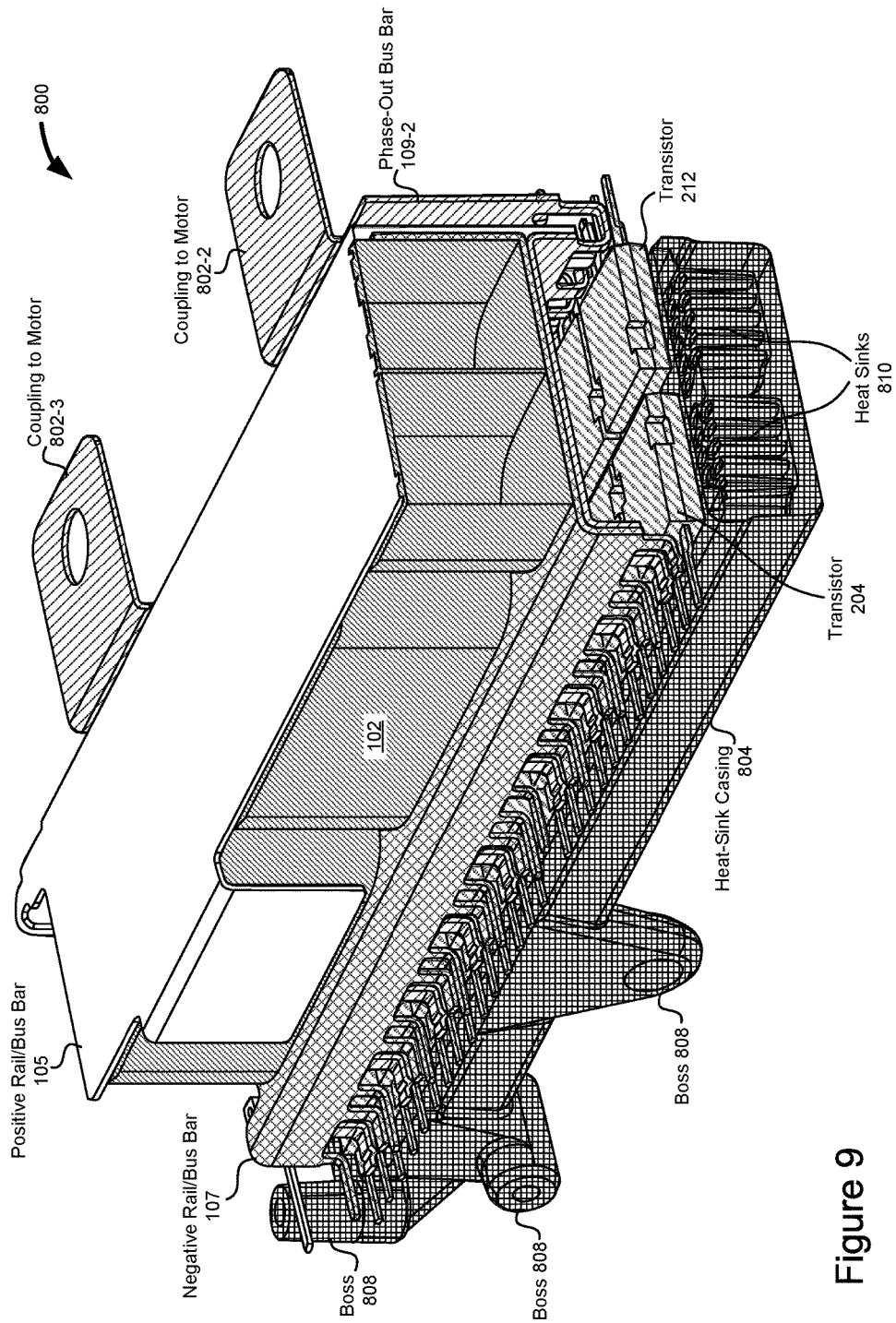
FIG. 9 is a cut-away perspective diagram illustrating components of the three-phase inverter of FIG. 8 in accordance with some implementations.

FIG. 7 is a perspective diagram illustrating components of a three-phase inverter 700 in accordance with some implementations. FIG. 7 shows the inverter 200 coupled to a board 702. In some implementations, the board 702 comprises a printed circuit board (PCB). In some implementations, the board 702 includes circuitry, such as driver circuitry (not shown), for controlling switching of the transistors 202, 204, 206, 210, 212, and 214. In some implementations, the drivers 112 and 114 (FIG. 1A) are located on the board 702 (e.g., for each of the three phases). In some implementations, the board 702 includes distinct driver circuitry for each set of transistors 202, 204, 206, 210, 212, and 214. While the case 602 is not shown in FIG. 7, in practice the inverter 700 includes the case 602 (e.g., is an example of the inverter 600, FIG. 6).

In FIGS. 2-7, the transistors 202, 204, 206, 210, 212, and 214 are located above and to the sides of the case 602 (and thus above and to the sides of the capacitor 102) in a wing-like configuration. Alternatively, the transistors 202, 204, 206, 210, 212, and 214 may be situated in-line with the case 602 (and thus in-line with the capacitor 102). FIGS. 8-13 illustrate an inverter 800 with such a configuration: the transistors 202, 204, 206, 210, 212, and 214 are located between the capacitor 102 and an underlying heat-sink casing 804, in accordance with some embodiments. The heat-sink casing 804 is shown in FIGS. 8-10 and 13, with FIG. 10 providing a side view and FIG. 13 providing a bottom perspective view. Electrically, the inverter 800 (FIGS. 8-13) is schematically equivalent to the inverter 200 (FIGS. 2-7).

The heat-sink casing 804 includes one or more heat sinks 810 (FIG. 9) for the transistors 202, 204, 206, 210, 212, and 214. In some embodiments, each transistor includes an exposed metallic lead-frame 814 (FIG. 12, which is a bottom perspective view of the inverter with the heat-sink casing 804 omitted to reveal the transistors) The metallic lead-frame 814 (e.g., a copper slug) is exposed through the transistor's packaging and is connected to the heat-sink casing 804, and thus to the heat sinks 810. The connection between the metallic lead-frames 814 and the heat sinks 810 dissipates heat from the transistors. The heat-sink casing 804 has an internal channel through which fluid flows to dissipate heat from the heat sinks 810 and thus from the transistors. The fluid enters the channel through a fluid connection 806 at a first end of the heat-sink casing 804, flows around the heat sinks 810, and exits the channel through a fluid connection 806 at a second end of the heat-sink casing 804. The heat-sink casing 804 also includes mounting bosses 808 (e.g., threaded bosses). For example, the mounting bosses 808 connect the heat-sink casing 804 to a supporting structure (e.g., in the electric vehicle powered by the inverter), an associated case (distinct from the case 602), and/or an associated printed circuit board (e.g., with drivers 112 and 114, FIG. 1A). (The heat-sink casing 804 is omitted from FIG. 11 as well as FIG. 12, for visual clarity.)

The case 602 is not shown in FIGS. 8-13 for visual clarity, so that components within the case 602 may be seen. In the example of FIGS. 8-13, the case 602 is situated upside-down in comparison to the configuration of FIG. 6, such that the top side of the case 602 faces the transistors 202, 204, 206, 210, 212, and 214 and the bottom side of the case 602 faces upward (in the orientation of FIGS. 8-13). Components in the case 602 include the capacitor 102 (e.g., capacitor components 102-1, 102-2, etc.) and respective portions (e.g., conductive sheets) of the positive rail/bus bar 105, negative rail/bus bar 107, and phase-out bus bars 109-1, 109-2, and 109-3. Portions of the positive rail/bus bar 105, negative rail/bus bar 107, and phase-out bus bars 109-1, 109-2, and 109-3 extend from the top side of the case 602 to contact respective leads of the transistors 202, 204, 206, 210, 212, and 214. The case 602 may be sealed with sealant 604.

Each phase-out bus bar 109-1, 109-2, and 109-3 includes a respective motor-coupling portion 802-1, 802-2, and 802-3 to provide a respective phase of AC current to the motor (e.g., motor 110, FIGS. 1A-1B). The motor-coupling portions 802-1, 802-2, and 802-3 are formed by portions of the phase-out bus bars 109-1, 109-2, and 109-3 that extend from the case 602. In some embodiments, the motor-coupling portions 802-1, 802-2, and 802-3 are implemented as angle brackets with apertures for connecting the motor-coupling portions 802-1, 802-2, and 802-3 to leads for the motor. A battery coupling 812 (FIGS. 11-12) includes two prongs, respectively connected to the positive rail/bus bar 105 and the negative rail/bus bar 107, to connect to the battery (e.g., battery 108, FIGS. 1A-1B). The prongs connect to respective portions of the positive rail/bus bar 105 and the negative rail/bus bar 107 that extend from the case 602.

The inverter 800, with the transistors 202, 204, 206, 210, 212, and 214 in-line between the capacitor 102 and heat-sink casing 804, has a compact arrangement that integrates efficiently with the rest of the drive unit in an electric vehicle. This compact arrangement increases the inverter's volumetric power density.

In light of FIGS. 1-13, certain implementations are now described.

In accordance with some implementations, an inverter includes: (1) a case (e.g., the case 602); (2) a capacitor situated in the case (e.g., the capacitor 102), the capacitor having a first terminal and a second terminal; (3) a first transistor external to the case (e.g., the transistor 214-1, or alternatively the transistor 202-1) and coupled to the first terminal of the capacitor; (4) a second transistor external to the case (e.g., the transistor 202-1, or alternatively the transistor 214-1) and coupled between the first transistor and the second terminal of the capacitor; (5) a first bus bar (e.g., the positive rail/bus bar 105, or alternatively the negative rail/bus bar 107) to connect the first terminal of the capacitor to the first transistor, the first bus bar comprising a first portion situated in the case and a second portion extending from the case to contact the first transistor (e.g., the positive coupling 604-1, or alternatively the negative coupling 608-1); (6) a second bus bar (e.g., the negative rail/bus bar 107, or alternatively the positive rail/bus bar 105) to connect the second terminal of the capacitor to the second transistor, the second bus bar comprising a first portion situated in the case and a second portion extending from the case to contact the second transistor (e.g., the negative coupling 608-1, or alternatively the positive coupling 604-1); and (7) a phase-out bus bar (e.g., the phase-out bus bar 109-1) to connect the first transistor to the second transistor, the phase-out bus bar comprising a first portion situated in the case, a second portion extending from the case to contact the first transistor (e.g., the phase-out coupling 606-1, or alternatively the phase-out coupling 610-1), and a third portion extending from the case to contact the second transistor (e.g., the phase-out coupling 610-1, or alternatively the phase-out coupling 606-1).

Figure 10:
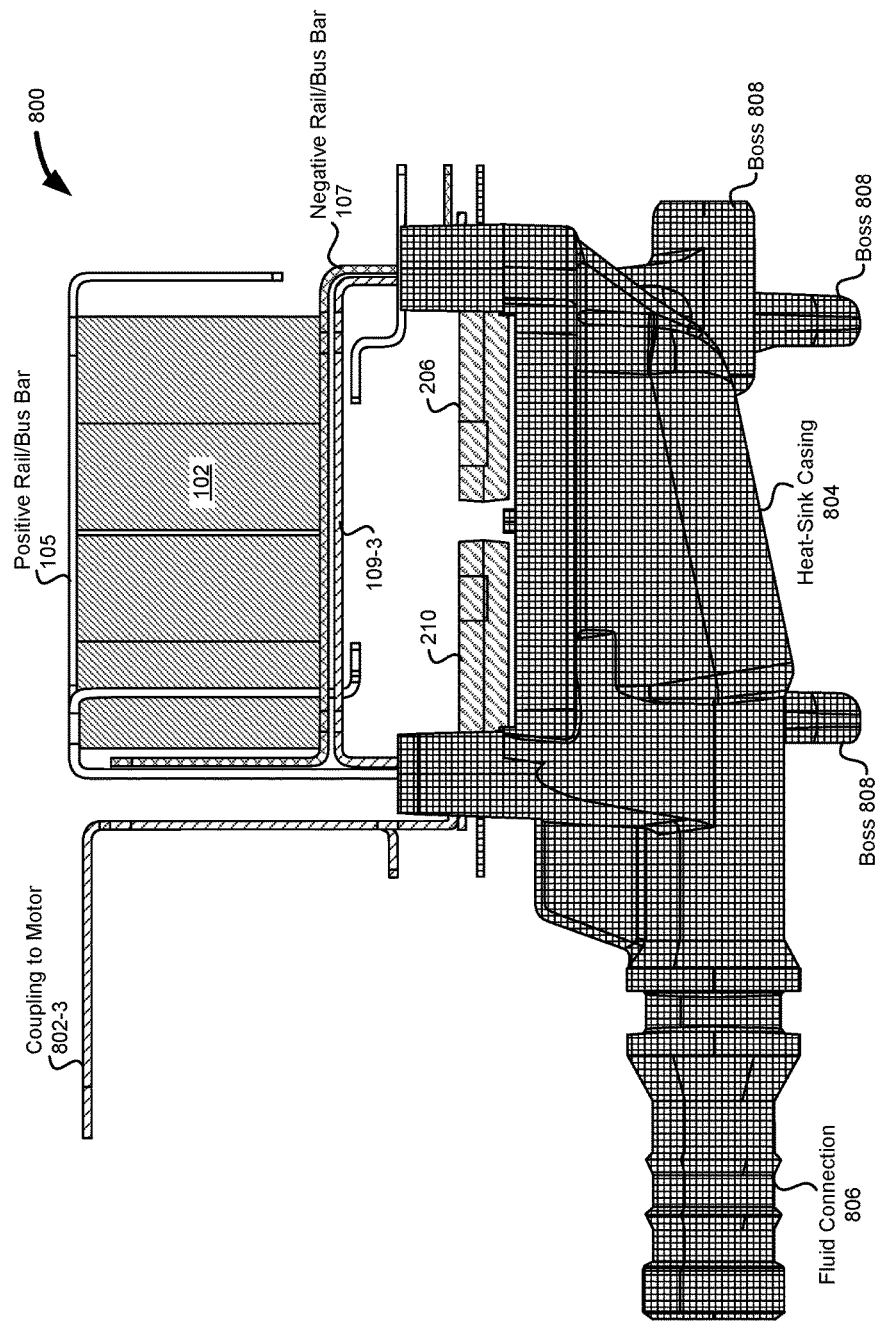
FIG. 10 illustrates a side-view of the three-phase inverter of FIG. 8 in accordance with some implementations.
Figure 11:
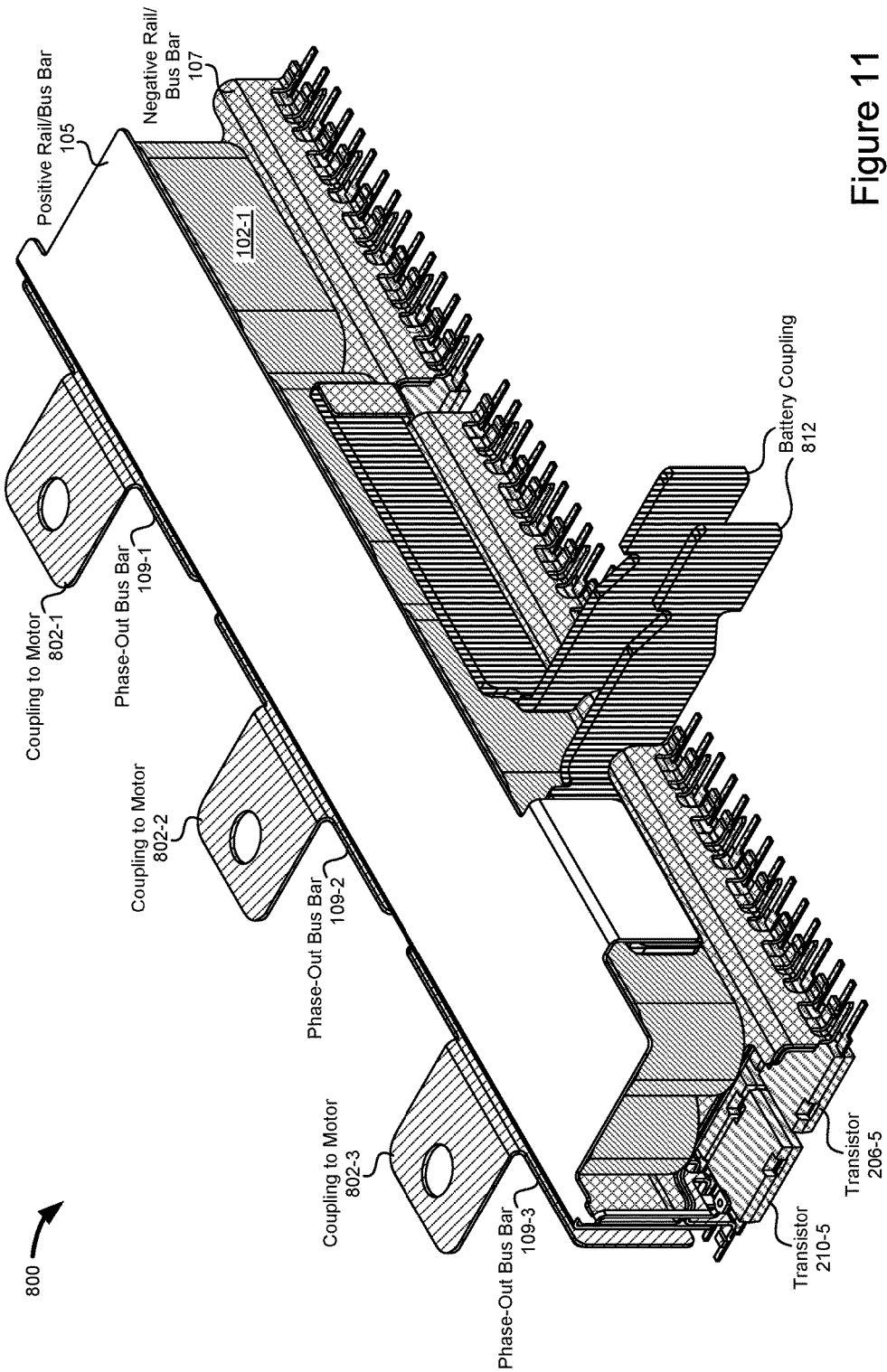
FIG. 11 is a perspective diagram illustrating components of the three-phase inverter of FIG. 8 in accordance with some implementations.
Figure 12:
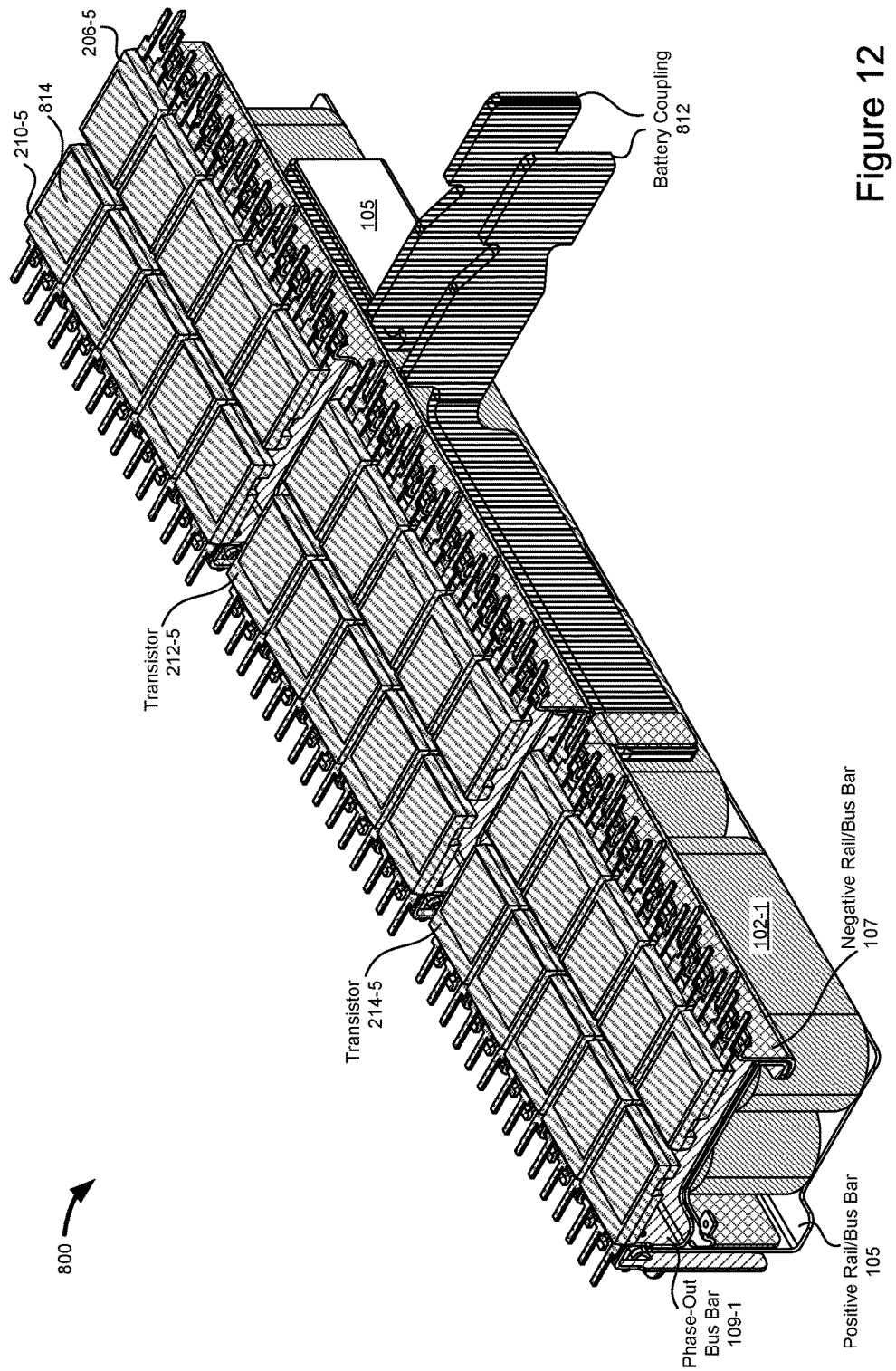
FIG. 12 is a bottom-view perspective diagram illustrating components of the three-phase inverter of FIG. 8 in accordance with some implementations.
Figure 13:
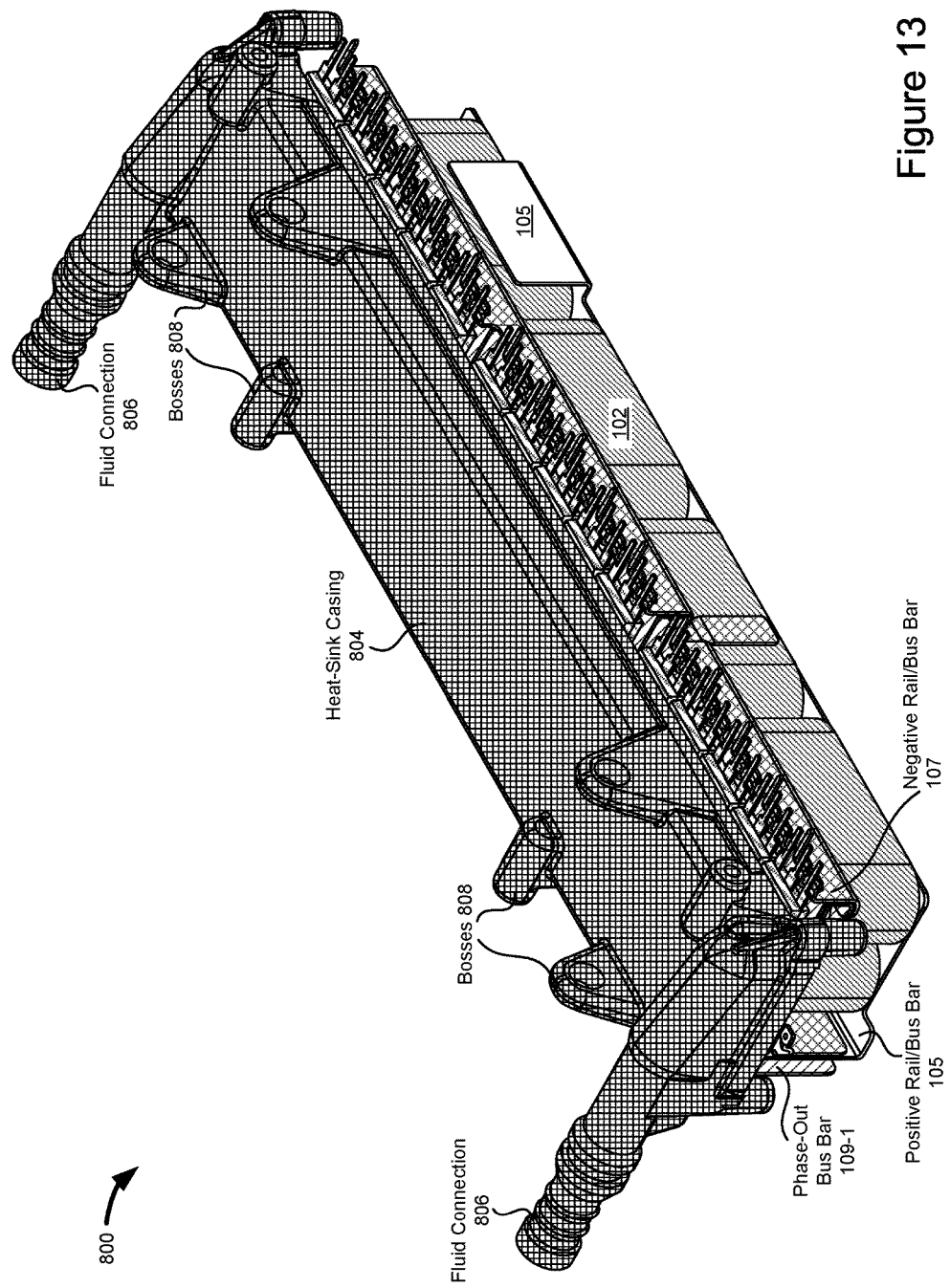
FIG. 13 is a bottom-view perspective diagram illustrating components of the three-phase inverter of FIG. 8 in accordance with some implementations.

In some implementations, the first portion of the phase-out bus bar comprises a conductive sheet (e.g., composed of metal) situated above the capacitor in the case. For example, FIGS. 2, 5, and 10 show each phase-out bus bar 109 having a portion comprising a conductive sheet situated above the capacitor 102. (In FIG. 10, the phase-out bus bars 109 are considered to be above the capacitor 102 because the capacitor 102 is upside-down with respect to FIGS. 2 and 5.) In some implementations, the first portion of the phase-out bus bar comprises a conductive sheet situated below, or to a side of, the capacitor in the case.

In some implementations: (1) the first terminal of the capacitor is on the bottom of the capacitor; (2) the first portion of the first bus bar comprises a conductive sheet situated below the capacitor in the case; (3) the second terminal of the capacitor is on the top of the capacitor; and (4) the first portion of the second bus bar comprises a conductive sheet situated above the capacitor and below the first portion of the phase-out bus bar in the case. For example, FIGS. 4, 5, and 8-11 show the positive rail/bus bar 105 coupled to a bottom of the capacitor 102 and comprising a conductive sheet situated below the capacitor. FIGS. 4, 5, and 8-11 also show the negative rail/bus bar 107 coupled to a top of the capacitor 102 and comprising a conductive sheet that is situated above the capacitor and below a conductive sheet that is a portion of the phase-out bus bar 109-1. (In FIGS. 8-11, the conductive sheet of negative rail/bus bar 107 is considered to be below the conductive sheet that is a portion of the phase-out bus bar 109-1 because the capacitor 102 is upside-down with respect to FIGS. 4 and 5.)

In some implementations, the first terminal of the capacitor is a positive terminal and the second terminal of the capacitor is a negative terminal. For example, FIGS. 5 and 10 show the bottom terminal (e.g., the first terminal) of the capacitor 102 coupled to the positive rail/bus bar 105 and the top terminal (e.g., the second terminal) of the capacitor 102 coupled to the negative rail/bus bar 107.

In some implementations, the case is sealed. The capacitor and the first portions of the first bus bar, second bus bar, and phase-out bus bar are sealed in the case. In some implementations, the case is sealed with epoxy. For example, FIG. 6 shows the case 602 sealed with sealant 604 with the coupling portions of the positive rail/bus bar 105, negative rail/bus bar 107, and phase-out bus bar 109 extending outside of the sealed case 602 and the other portions of the positive rail/bus bar 105, negative rail/bus bar 107, and phase-out bus bar 109 sealed within the case 602.

In some implementations: (1) the first and second transistors are insulated-gate bipolar transistors, each comprising an emitter, a collector, and a gate; (2) the collector of the first transistor is coupled to the first terminal of the capacitor via the first bus bar; (3) the emitter of the first transistor is coupled to the collector of the second transistor via the phase-out bus bar; and (4) the emitter of the second transistor is coupled to the second terminal of the capacitor via the second bus bar. For example, FIG. 5 shows the collector lead 502-2 of the transistor 214-1 coupled to the positive rail/bus bar 105, the collector lead 502-1 of the transistor 202-1 coupled to the emitter lead 504-2 of the transistor 214-1 via the phase-out bus bar 109-1, and the emitter lead 504-1 of the transistor 202-1 coupled to the negative rail/bus bar 107.

In some implementations: (1) the first and second transistors are silicon-carbide metal-oxide-semiconductor field-effect transistors (SiC MOSFETs) or gallium-nitride field-effect transistors (GaN FETs), each comprising a first source/drain terminal, a second source/drain terminal, and a gate; (2) the first source/drain terminal of the first transistor is coupled to the first terminal of the capacitor via the first bus bar; (3) the second source/drain terminal of the first transistor is coupled to the first source/drain terminal of the second transistor via the phase-out bus bar; and (4) the second source/drain terminal of the second transistor is coupled to the second terminal of the capacitor via the second bus bar.

In some implementations, the phase-out bus bar is a first phase-out bus bar (e.g., the phase-out bus bar 109-1) to provide a first phase of alternating current. The inverter further includes: (1) a third transistor external to the case (e.g., the transistor 212-1, or alternatively the transistor 204-1) and coupled to the first terminal of the capacitor; (2) a fourth transistor external to the case (e.g., the transistor 204-1, or alternatively the transistor 212-1) and coupled between the third transistor and the second terminal of the capacitor; and (3) a second phase-out bus bar (e.g., the phase-out bus bar 109-2), distinct from the second bus bar, to connect the third transistor to the fourth transistor and to provide a second phase of alternating current. The second phase-out bus bar comprises a first portion situated in the case, a second portion extending from the case to contact the third transistor, and a third portion extending from the case to contact the fourth transistor.

In some implementations, the inverter further includes: (1) a fifth transistor external to the case (e.g., the transistor 210-1, or alternatively the transistor 206-1) and coupled to the first terminal of the capacitor; (2) a sixth transistor external to the case (e.g., the transistor 206-1, or alternatively the transistor 210-1) and coupled between the fifth transistor and the second terminal of the capacitor; and (3) a third phase-out bus bar (e.g., the phase-out bus bar 109-3)

to connect the fifth transistor to the sixth transistor and to provide a third phase of alternating current. The third phase-out bus bar comprises a first portion situated in the case, a second portion extending from the case to contact the fifth transistor, and a third portion extending from the case to contact the sixth transistor.

In some implementations, the first portions of the first, second, and third phase-out bus bars comprise respective first, second, and third conductive sheets situated above the capacitor in the case and arranged in a line. For example, FIG. 2 shows the phase-out bus bars 109-1, 109-2, and 109-3 each having a sheet portion situated above the capacitor 102 and arranged in a line.

In some implementations: (1) the first terminal of the capacitor is on the bottom of the capacitor; (2) the first portion of the first bus bar comprises a conductive sheet situated below the capacitor in the case; (3) the second terminal of the capacitor is on the top of the capacitor; and (4) the first portion of the second bus bar comprises a conductive sheet situated above the capacitor and below the first, second, and third conductive sheets. For example, FIGS. 4, 5, and 8-11 show the positive rail/bus bar 105 coupling to a bottom of the capacitor 102 and comprising a conductive sheet below the capacitor 102, the negative rail/bus bar 107 coupling to a top of the capacitor 102 and comprising a conductive sheet above the capacitor 102, and the conductive sheets of the phase-out bus bars 109 situated above the conductive sheet of the negative rail/bus bar 107. (Again, the capacitor 102 is upside down in FIGS. 8-11 as compared to FIGS. 4 and 5.)

In some implementations: (1) the first transistor is one of a first plurality of transistors (e.g., the transistors 214-1 through 214-5, or alternatively the transistors 202-1 through 202-5) coupled to the first terminal of the capacitor, the first plurality of transistors being external to the case; (2) the second transistor is one of a second plurality of transistors (e.g., the transistors 202-1 through 202-5, or alternatively the transistors 214-1 through 214-5) coupled between the first plurality of transistors and the second terminal of the capacitor, the second plurality of transistors being external to the case; (3) the first bus bar connects the first terminal of the capacitor to the first plurality of transistors and comprises a plurality of portions (e.g., the positive couplings 604-1 through 604-5, or alternatively the negative couplings 608-1 through 608-5) extending from the case to contact respective transistors of the first plurality of transistors; (4) the second bus bar connects the second terminal of the capacitor to the second plurality of transistors and comprises a plurality of portions (e.g., the negative couplings 608-1 through 608-5, or alternatively the positive couplings 604-1 through 604-5) extending from the case to contact respective transistors of the second plurality of transistors; and (5) the phase-out bus bar connects the first plurality of transistors to the second plurality of transistors and comprises a first plurality of portions (e.g., the phase-out couplings 604-1 through 604-5, or alternatively the phase-out couplings 610-1 through 610-5) extending from the case to contact respective transistors of the first plurality of transistors and a second plurality of portions (e.g., the phase-out couplings 610-1 through 610-5, or alternatively the phase-out couplings 604-1 through 604-5) extending from the case to contact respective transistors of the second plurality of transistors.

In some implementations, each transistor of the first and second pluralities of transistors is a discrete transistor with its own package. For example, FIG. 2 shows each transistor 202 and each transistor 214 as discrete transistors with discrete packaging. Each transistor 204, 206, 210, and 210 may also be a discrete transistor with discrete packaging.

In some implementations, the phase-out bus-bar is a first phase-out bus bar to provide a first phase of alternating current, and the inverter further includes: (1) a third plurality of transistors (e.g., the transistors 212-1 through 212-5, or alternatively the transistors 204-1 through 204-5) coupled to the first terminal of the capacitor, the third plurality of transistors being external to the case; (2) a fourth plurality of transistors (e.g., the transistors 204-1 through 204-5, or alternatively the transistors 212-1 through 212-5) coupled between the third plurality of transistors and the second terminal of the capacitor, the fourth plurality of transistors being external to the case; (3) a second phase-out bus bar (e.g., phase-out bus bar 109-2) to connect the third plurality of transistors to the fourth plurality of transistors and to provide a second phase of alternating current, the second phase-out bus bar comprising a portion situated in the case and a plurality of portions extending from the case to contact respective transistors of the third and fourth pluralities of transistors; (4) a fifth plurality of transistors (e.g., the transistors 210-1 through 210-5, or alternatively the transistors 206-1 through 206-5) coupled to the first terminal of the capacitor, the fifth plurality of transistors being external to the case; (5) a sixth plurality of transistors (e.g., the transistors 206-1 through 206-5, or alternatively the transistors 210-1 through 210-5) coupled between the fifth plurality of transistors and the second terminal of the capacitor, the sixth plurality of transistors being external to the case; and (6) a third phase-out bus bar (e.g., the phase-out bus bar 109-3) to connect the fifth plurality of transistors to the sixth plurality of transistors and to provide a third phase of alternating current, the third phase-out bus bar comprising a portion situated in the case and a plurality of portions extending from the case to contact respective transistors of the fifth and sixth pluralities of transistors. The first bus bar connects the first terminal of the capacitor to the third and fifth pluralities of transistors and comprises a plurality of portions extending from the case to contact respective transistors of the third and fifth pluralities of transistors. The second bus bar connects the second terminal of the capacitor to the fourth and sixth pluralities of transistors and comprises a plurality of portions extending from the case to contact respective transistors of the fourth and sixth pluralities of transistors.

In accordance with some implementations, a three-phase inverter includes: (1) a sealed case (e.g., the case 602); (2) a capacitor sealed in the case (e.g., the capacitor 102), the capacitor having a first terminal and a second terminal; (3) first, second, third, fourth, fifth and sixth pluralities of transistors (e.g., the transistors 202, 204, 206, 210, 212, and 214) external to the case, where: (a) the first, third, and fifth pluralities of transistors are coupled to the first terminal of the capacitor (e.g., the transistors 214, 212, and 210, or alternatively the transistors 202, 204, and 206); and (b) the second, fourth, and sixth pluralities of transistors (e.g., the transistors 202, 204, and 206, or alternatively the transistors 214, 212, and 210) are coupled to the second terminal of the capacitor; (4) a first bus bar (e.g., the positive rail/bus bar 105, or alternatively the negative rail/bus bar 107) to connect the first terminal of the capacitor to the first, third, and fifth pluralities of transistors, the first bus bar comprising a first portion sealed in the case and respective portions extending from the case to contact respective transistors of the first, third, and fifth pluralities of transistors; (5) a second bus bar (e.g., the negative rail/bus bar 107, or alternatively the positive rail/bus bar 105) to connect the second terminal of the capacitor to the second, fourth, and sixth pluralities of transistors, the second bus bar comprising a first portion sealed in the case and respective portions extending from the case to contact respective transistors of the second, fourth, and sixth pluralities of transistors; (6) a first phase-out bus bar (e.g., the phase-out bus bar 109-1) to connect the first plurality of transistors to the second plurality of transistors and to provide a first phase of alternating current, the first phase-out bus bar comprising a portion sealed in the case and respective portions extending from the case to contact respective transistors of the first and second pluralities of transistors; (7) a second phase-out bus bar (e.g., the phase-out bus bar 109-2) to connect the third plurality of transistors to the fourth plurality of transistors and to provide a second phase of alternating current, the second phase-out bus bar comprising a portion sealed in the case and respective portions extending from the case to contact respective transistors of the third and fourth pluralities of transistors; and (8) a third phase-out bus bar (e.g., the phase-out bus bar 109-3) to connect the fifth plurality of transistors to the sixth plurality of transistors and to provide a third phase of alternating current, the third phase-out bus bar comprising a portion sealed in the case and respective portions extending from the case to contact respective transistors of the fifth and sixth pluralities of transistors.

It will also be understood that, although the terms first, second, etc. are, in some instances, used herein to describe various elements, these elements should not be limited by these terms. These terms are only used to distinguish one element from another. For example, a first transistor could be termed a second transistor, and, similarly, a second transistor could be termed a first transistor, without departing from the scope of the various described implementations. The first transistor and the second transistor are both transistors, but they are not the same transistor unless explicitly stated as such.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. An inverter component, comprising:
   a case;
   a capacitor situated in the case and having a first terminal and a second terminal;
   one or more heat sinks external to the case to provide heat-sinking for a first transistor connected to the capacitor by a first bus bar and a second transistor connected to the capacitor by a second bus bar, the first and second transistors situated between the case and the one or more heat sinks; and
   a phase-out bus bar configured to electrically-couple the first transistor to the second transistor, the phase-out bus bar comprising a first portion within the case, a second portion extending from the case to contact the first transistor, and a third portion extending from the case to contact the second transistor.

2. The inverter component of claim 1, wherein the first portion of the phase-out bus bar comprises a conductive sheet situated above the capacitor in the case.

3. The inverter component of claim 2, wherein:
   the inverter component further comprises:
      the first bus bar to connect the first terminal of the capacitor to the first transistor, the first bus bar comprising a first portion situated in the case and a second portion extending from the case to contact the first transistor; and
      the second bus bar to connect the second terminal of the capacitor to the second transistor, the second bus bar comprising a first portion situated in the case and a second portion extending from the case to contact the second transistor;
   the first terminal of the capacitor is on the bottom of the capacitor;
   the first portion of the first bus bar comprises a conductive sheet situated below the capacitor in the case;
   the second terminal of the capacitor is on the top of the capacitor; and
   the first portion of the second bus bar comprises a conductive sheet situated above the capacitor and below the first portion of the phase-out bus bar in the case.

4. The inverter component of claim 3, wherein:
   the first terminal of the capacitor is a positive terminal; and
   the second terminal of the capacitor is a negative terminal.

5. The inverter component of claim 1, wherein the case is sealed, the capacitor and the first portion of the phase-out bus bar is sealed in the case.

6. The inverter component of claim 5, wherein the case is sealed with epoxy.

7. The inverter component of claim 1, wherein:
   the first and second transistors are insulated-gate bipolar transistors, each comprising an emitter, a collector, and a gate;
   the collector of the first transistor is coupled to the first terminal of the capacitor via the first bus bar;
   the emitter of the first transistor is coupled to the collector of the second transistor via the phase-out bus bar; and the emitter of the second transistor is coupled to the second terminal of the capacitor via the second bus bar.

8. The inverter component of claim 1, wherein:
the first and second transistors are silicon-carbide metal-oxide-semiconductor field-effect transistors (SiC MOSFETs) or gallium-nitride field-effect transistors (GaN FETs), each comprising a first source/drain terminal, a second source/drain terminal, and a gate;
the first source/drain terminal of the first transistor is coupled to the first terminal of the capacitor via the first bus bar;
the second source/drain terminal of the first transistor is coupled to the first source/drain terminal of the second transistor via the phase-out bus bar; and
the second source/drain terminal of the second transistor is coupled to the second terminal of the capacitor via the second bus bar.

9. The inverter component of claim 1, wherein the phase-out bus bar is a first phase-out bus bar to provide a first phase of alternating current, the inverter component further comprising:
a second phase-out bus bar, distinct from the second bus bar, to connect a third transistor to a fourth transistor and to provide a second phase of alternating current, the second phase-out bus bar comprising a first portion situated in the case, a second portion extending from the case to contact the third transistor, and a third portion extending from the case to contact the fourth transistor.

10. The inverter component of claim 9, further comprising:
a third phase-out bus bar to connect a fifth transistor to a sixth transistor and to provide a third phase of alternating current, the third phase-out bus bar comprising a first portion situated in the case, a second portion extending from the case to contact the fifth transistor, and a third portion extending from the case to contact the sixth transistor.

11. The inverter component of claim 10, wherein the first portions of the first, second, and third phase-out bus bars comprise respective first, second, and third conductive sheets situated above the capacitor in the case and arranged in a line.

12. The inverter component of claim 11, wherein:
the first terminal of the capacitor is on the bottom of the capacitor;
the first portion of the first bus bar comprises a conductive sheet situated below the capacitor in the case;
the second terminal of the capacitor is on the top of the capacitor; and
the first portion of the second bus bar comprises a conductive sheet situated above the capacitor and below the first, second, and third conductive sheets.

13. The inverter component of claim 10, further comprising one or more additional heat sinks to provide heat-sinking for the first, second, third, fourth, fifth, and sixth transistors;
wherein the first, second, third, fourth, fifth, and sixth transistors are situated between the case and the one or more additional heat sinks.

14. The inverter component of claim 1, wherein:
the first transistor is one of a first plurality of transistors coupled to the first terminal of the capacitor, the first plurality of transistors being external to the case;
the second transistor is one of a second plurality of transistors coupled between the first plurality of transistors and the second terminal of the capacitor, the second plurality of transistors being external to the case;
the first bus bar connects the first terminal of the capacitor to the first plurality of transistors and comprises a plurality of portions extending from the case to contact respective transistors of the first plurality of transistors;
the second bus bar connects the second terminal of the capacitor to the second plurality of transistors and comprises a plurality of portions extending from the case to contact respective transistors of the second plurality of transistors; and
the phase-out bus bar connects the first plurality of transistors to the second plurality of transistors and comprises a first plurality of portions extending from the case to contact respective transistors of the first plurality of transistors and a second plurality of portions extending from the case to contact respective transistors of the second plurality of transistors.

15. The inverter component of claim 14, wherein each transistor of the first and second pluralities of transistors is a discrete transistor with its own package.

16. The inverter component of claim 14, wherein the phase-out bus bar is a first phase-out bus bar to provide a first phase of alternating current, the inverter component further comprising:
a second phase-out bus bar to connect a third plurality of transistors to a fourth plurality of transistors and to provide a second phase of alternating current, the second phase-out bus bar comprising a portion situated in the case and a plurality of portions extending from the case to contact respective transistors of the third and fourth pluralities of transistors; and
a third phase-out bus bar to connect a fifth plurality of transistors to a sixth plurality of transistors and to provide a third phase of alternating current, the third phase-out bus bar comprising a portion situated in the case and a plurality of portions extending from the case to contact respective transistors of the fifth and sixth pluralities of transistors; wherein:
the first bus bar connects the first terminal of the capacitor to the third and fifth pluralities of transistors and comprises a plurality of portions extending from the case to contact respective transistors of the third and fifth pluralities of transistors; and
the second bus bar connects the second terminal of the capacitor to the fourth and sixth pluralities of transistors and comprises a plurality of portions extending from the case to contact respective transistors of the fourth and sixth pluralities of transistors.

17. A three-phase inverter component, comprising:
a sealed case;
a capacitor sealed in the case, the capacitor having a first terminal and a second terminal;
a first bus bar configured to electrically-couple the first terminal of the capacitor to each of a first, third, and fifth pluralities of transistors, the first bus bar comprising a first portion sealed in the case and respective portions extending from the case to contact respective transistors of the first, third, and fifth pluralities of transistors;
a second bus bar configured to electrically-couple the second terminal of the capacitor to each of a second, fourth, and sixth pluralities of transistors, the second bus bar comprising a first portion sealed in the case and respective portions extending from the case to contact respective transistors of the second, fourth, and sixth pluralities of transistors;

a first phase-out bus bar configured to electrically-couple the first plurality of transistors to the second plurality of transistors and to provide a first phase of alternating current, the first phase-out bus bar comprising a portion sealed in the case and respective portions extending from the case to contact respective transistors of the first and second pluralities of transistors;

a second phase-out bus bar configured to electrically-couple the third plurality of transistors to the fourth plurality of transistors and to provide a second phase of alternating current, the second phase-out bus bar comprising a portion sealed in the case and respective portions extending from the case to contact respective transistors of the third and fourth pluralities of transistors; and a third phase-out bus bar configured to electrically-couple the fifth plurality of transistors to the sixth plurality of transistors and to provide a third phase of alternating current, the third phase-out bus bar comprising a portion sealed in the case and respective portions extending from the case to contact respective transistors of the fifth and sixth pluralities of transistors.

* * * * *

UNITED STATES PATENT AND TRADEMARK OFFICE
CERTIFICATE OF CORRECTION

PATENT NO. : 10,236,786 B2
APPLICATION NO. : 15/831307
DATED : March 19, 2019
INVENTOR(S) : Liu et al.

Page 1 of 1

It is certified that error appears in the above-identified patent and that said Letters Patent is hereby corrected as shown below:

In the Claims

Claim 5, Column 14, Line 55, delete "sealed, the" and insert --sealed, and the--;

Claim 5, Column 14, Line 56, delete "bar is sealed" and insert --bar are sealed--.

Signed and Sealed this
Twenty-eighth Day of May, 2019

Andrei Iancu
*Director of the United States Patent and Trademark Office*